United States Patent
Yoneda

(10) Patent No.: US 7,368,735 B2
(45) Date of Patent: May 6, 2008

(54) CHARGED BEAM DRAWING DATA CREATION METHOD, CHARGED BEAM DRAWING METHOD, CHARGED BEAM DRAWING APPARATUS AND SEMICONDUCTOR DEVICE MANUFACTURING METHOD

(75) Inventor: Ikuo Yoneda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 317 days.

(21) Appl. No.: 11/295,533

(22) Filed: Dec. 7, 2005

(65) Prior Publication Data
US 2006/0118734 A1    Jun. 8, 2006

(30) Foreign Application Priority Data
Dec. 7, 2004    (JP)    ............... 2004-354467

(51) Int. Cl.
G21K 5/04    (2006.01)
(52) U.S. Cl. .............. 250/492.22; 250/492.2; 250/492.1; 250/492.3; 716/19; 716/21; 430/296
(58) Field of Classification Search .......... 250/492.22, 250/492.2, 492.1, 492.3; 716/19, 21; 430/296
See application file for complete search history.

(56) References Cited
U.S. PATENT DOCUMENTS
5,879,860 A    3/1999    Rosolen et al.
5,955,738 A *  9/1999    Manabe et al. ........ 250/492.22
6,103,434 A *  8/2000    Onoda ..................... 430/30
6,104,035 A *  8/2000    Muraki ................ 250/492.22

FOREIGN PATENT DOCUMENTS
JP    3085918    7/2000
JP    3125724    11/2000
JP    3168996    3/2001

* cited by examiner

Primary Examiner—Robert Kim
Assistant Examiner—Michael Maskell
(74) Attorney, Agent, or Firm—Finnegan, Henderson, Farabow, Garrett & Dunner, L.L.P.

(57) ABSTRACT

Drawing-data creating method includes selecting charged beam drawing-apparatus dividing drawing area into main fields, subfields and unit fields (U-fields), dividing design data (D-data) corresponding to pattern drawn on area into first D-data corresponding to main fields, dividing first D-data into second D-data corresponding to subfields, dividing second D-data into third D-data corresponding to U-fields, evaluating resist resolution to predetermined dimension on U-fields, creating table relating U-fields to resolution based on result of evaluating the resolution, judging whether third D-data corresponds to data having the dimension and corresponds to pattern falling in U-field having rejectable resolution is based on the dimension and table, and converting data judged to correspond to the data among third D-data into first drawing-data after coordinate conversion so that the data fall in U-field having acceptable resolution, and converting data judged not to correspond to the data among third D-data into second drawing-data without coordinate conversion.

12 Claims, 10 Drawing Sheets

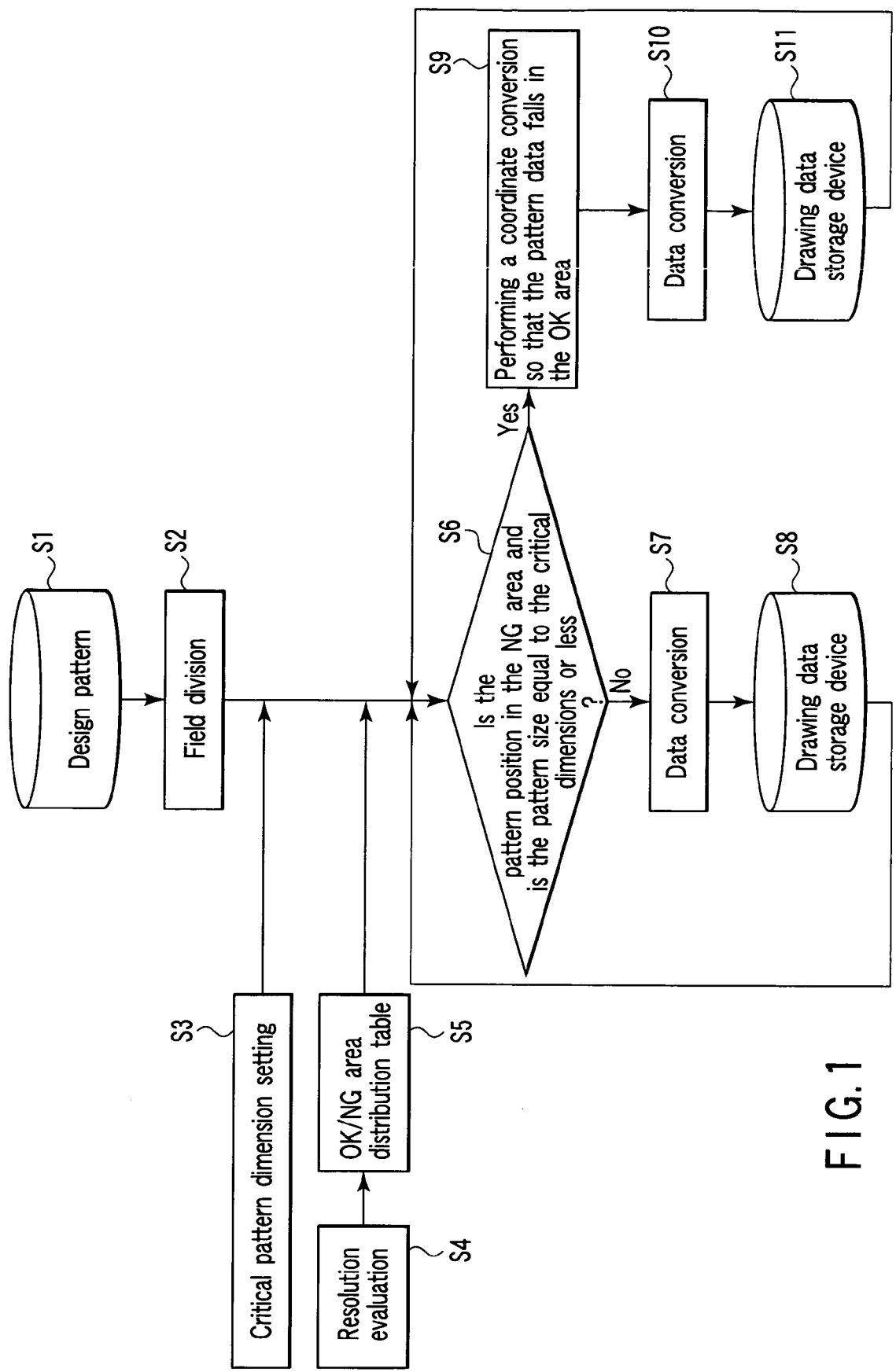
F I G. 1

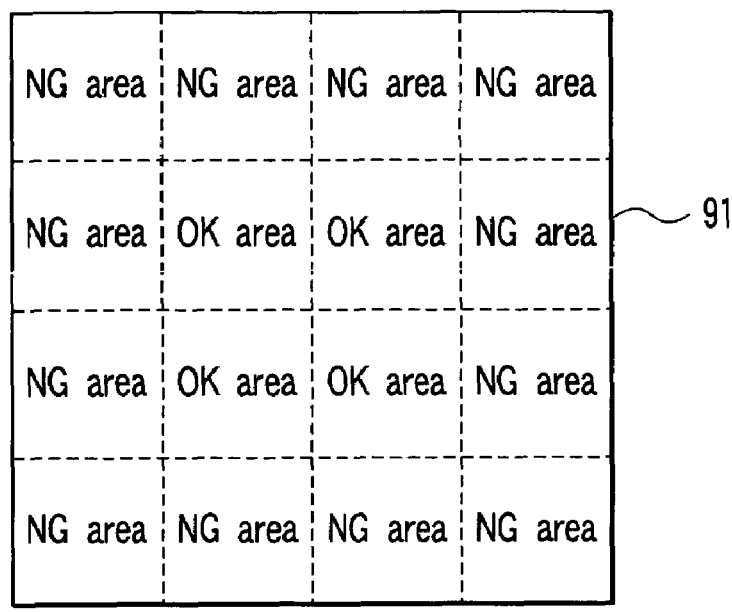
F I G. 4
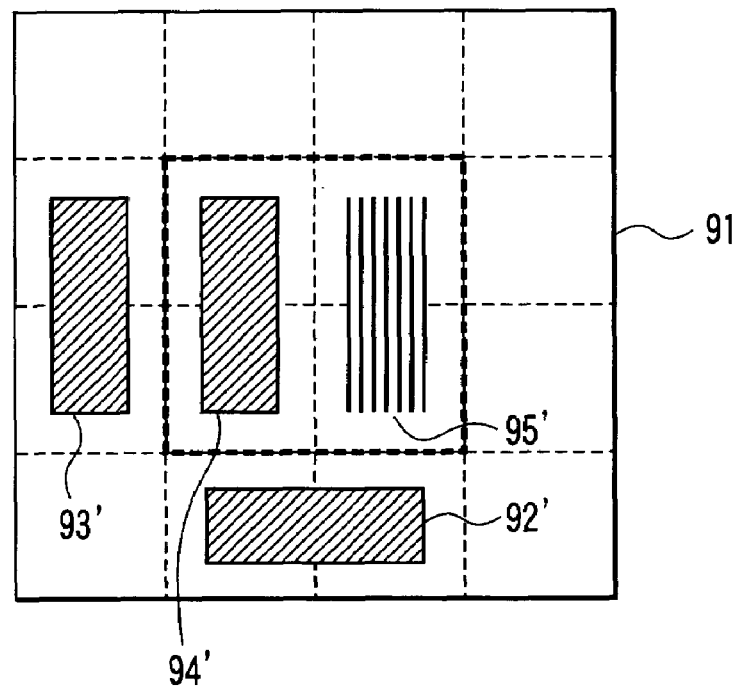
F I G. 5

CHARGED BEAM DRAWING DATA CREATION METHOD, CHARGED BEAM DRAWING METHOD, CHARGED BEAM DRAWING APPARATUS AND SEMICONDUCTOR DEVICE MANUFACTURING METHOD

CROSS-REFERENCE TO RELATED APPLICATIONS

This application is based upon and claims the benefit of priority from prior Japanese Patent Application No. 2004-354467, filed Dec. 7, 2004, the entire contents of which are incorporated herein by reference.

BACKGROUND OF THE INVENTION

1. Field of the Invention

The present invention relates to a method of creating charged beam drawing data used for a charged beam drawing apparatus to draw a pattern on a sample using a charged beam, a charged beam drawing method, a charged beam drawing apparatus and a semiconductor device manufacturing method.

2. Description of the Related Art

In manufacturing of LSI currently, there is an increasing demand for high precision of pattern transferring and processing dimensions for high integration of wires and devices. To respond to such a demand, recently, an electron beam drawing apparatus has been used for drawing a fine pattern on a sample such as a semiconductor wafer or a mask substrate.

Design data of a device pattern to be drawn on a sample is normally converted beforehand into drawing data corresponding to a drawing apparatus. The drawing data is recorded (stored) into a storage device or the like attached to the drawing apparatus.

The step for converting the design data into the drawing data includes a step of decomposing the device pattern into relatively simple patterns (for example, rectangular patterns), and a step of dividing the design pattern into mesh fields corresponding to the deflection width of an electron beam of the drawing apparatus.

In the pattern drawing by an electron beam drawing apparatus, an electron beam where an electron generated from an electron source is accelerated is formed through a plurality of variable apertures with reference to the drawing data, and this formed electron beam is deflected by two stages or more of deflectors, and focused onto a sample on a movable stage by an electromagnetic lens, thereby a pattern is drawn (Japanese Patent Nos. 3085918, 3125724, and 3168996).

FIG. 14 is a view schematically showing an example of the field division of design data that is performed in electron beam drawing. In FIG. 14, a subfield is divided into 4×4.

In FIG. 14, reference numeral 91 (square shown by a thick solid line) shows a subfield, 92 to 94 (patterns shown by diagonal lines) show design data corresponding to drawing data of relatively large dimensions (for example, 130 nm L&S or pad electrode), 95 to 97 (patterns shown by stripes) show design data corresponding to drawing data of relatively fine dimensions (for example, 60 nm L&S).

At the center of a drawing field, the deflection angle by a corresponding deflector is zero. At the portion that is more apart from the center of the field, the deflection angle of an electron beam becomes larger. When the deflection angle of the electron beam is large, blurring of the beam becomes relatively large owing to aberration of the electromagnetic lens and the like, and as a consequence, the resolution of the pattern drawing becomes lower than that at the center of the field.

FIG. 15 shows results (SEM photos) of an evaluation by an SEM on resist pattern drawn by a conventional drawing method by use of the design data of FIG. 14, and obtained after a developing process and the like.

From FIG. 15, it is known that the resolution of the fine pattern that is near the field center entangled by a dotted line is relatively preferable. Further, it is known that there is not a significant problem in the resolution even in the relatively large pattern at the end of the field outside of the dotted line. However, it is known that, in the fine pattern at the edge of the field, the deterioration of the resolution is conspicuous, and it is extremely difficult to resolve the fine pattern.

As a method for solving this problem, and for resolving fine patterns in the entire drawing area, there is known a method in which the drawing field is set small, and the electron beam deflection width is made small, thereby drawing is performed. However, in the above method, the number of drawing fields increases. Consequently, there occurs a problem that it requires longer drawing time than the above conventional drawing method, and the throughput is decreased.

BRIEF SUMMARY OF THE INVENTION

According to an aspect of the present invention, there is provided a method of creating charged beam drawing data used for a charged beam drawing apparatus to draw a pattern on a drawing area of a sample by irradiating a charged beam onto the sample, the method comprising: selecting a charged beam drawing apparatus which divides the drawing area into two or more hierarchical fields including a plurality of main fields, a plurality of subfields which are lower in layer than the plurality of main fields and a plurality of unit fields which are lower in layer than the plurality of subfields, and draws a pattern using the unit field as a drawing unit, as the charged beam drawing apparatus to draw the pattern; dividing design data corresponding to the pattern to be drawn on the drawing area into a plurality of first design data corresponding to the plurality of main fields, dividing each of the plurality of first design data into a plurality of second design data corresponding to the plurality of subfields, and dividing each of the plurality of second design data into a plurality of third design data corresponding to the plurality of unit fields; evaluating quality of resist resolution to a predetermined dimension on each of the plurality of unit fields; creating a table which relates the plurality of unit fields to the quality of the resist resolution based on an evaluation result acquired by the evaluating the quality of the resist resolution; judging whether or not each of the plurality of third design data corresponds to data having the predetermined dimension and corresponds to a pattern falling in the unit field which the quality of the resist resolution is rejectable based on the predetermined dimension and the table; and converting data judged to correspond to the data among the plurality of third design data into first drawing data after performing a coordinate conversion so that the data fall in the unit field which the resist resolution is acceptable, and converting data judged not to correspond to the data among the plurality of third design data into second drawing data without performing the coordinate conversion.

According to an aspect of the present invention, there is provided a charged beam drawing method using a charged beam drawing apparatus to draw a pattern on a drawing area of a sample by irradiating a charged beam onto the sample, the method comprising: selecting a charged beam drawing apparatus which divides the drawing area into two or more hierarchical fields including a plurality of main fields, a plurality of subfields which are lower in layer than the plurality of main fields and a plurality of unit fields which are lower in layer than the plurality of subfields, and draws a pattern using the unit field as a drawing unit, as the charged beam drawing apparatus to draw the pattern; dividing design data corresponding to the pattern to be drawn on the drawing area into a plurality of first design data corresponding to the plurality of main fields, dividing each of the plurality of first design data into a plurality of second design data corresponding to the plurality of subfields, and dividing each of the plurality of second design data into a plurality of third design data corresponding to the plurality of unit fields; evaluating quality of resist resolution to a predetermined dimension on each of the plurality of unit fields; creating a table which defines a unit field having an acceptable resist resolution and a unit field having a rejectable resist resolution among the plurality of unit fields based on an evaluation result acquired by the evaluating the quality of the resist resolution; judging whether or not each of the plurality of third design data corresponds to data having the predetermined dimension and corresponds to a pattern falling in the unit field which the quality of the resist resolution is rejectable based on the predetermined dimension and the table; and converting data judged to correspond to the data among the plurality of third design data into first drawing data after performing a coordinate conversion so that the data fall in the unit field which the resist resolution is acceptable, and converting data judged not to correspond to the data among the plurality of third design data into second drawing data without performing the coordinate conversion.

According to an aspect of the present invention, there is provided a charged beam drawing apparatus to draw a pattern on a drawing area of a sample by irradiating a charged beam onto the sample, the pattern being drawn using a unit field as a drawing unit, the charged beam drawing apparatus comprising: a first dividing section configured to divide the drawing area into two or more hierarchical fields including a plurality of main fields, a plurality of subfields which are lower in layer than the plurality of main fields and a plurality of unit fields which are lower in layer than the plurality of subfields, a second dividing section configured to divide design data corresponding to the pattern to be drawn on the drawing area into a plurality of first design data corresponding to the plurality of main fields, dividing each of the plurality of first design data into a plurality of second design data corresponding to the plurality of subfields, and dividing each of the plurality of second design data into a plurality of third design data corresponding to the plurality of unit fields; a resolution evaluating section configured to evaluate quality of resist resolution to a predetermined dimension on each of the plurality of unit fields; a table creating section configured to create a table which relates the plurality of unit fields to the quality of the resist resolution based on an evaluation result acquired by the evaluating the quality of the resist resolution; a judging section configured to judge whether or not each of the plurality of third design data corresponds to data having the predetermined dimension and corresponds to a pattern falling in the unit field which the quality of the resist resolution is rejectable based on the predetermined dimension and the table; a coordinate converting section configured to convert a coordinate of data judged to correspond to the data among the plurality of third design data into a coordinate so that the data fall in the unit field which the resist resolution is acceptable, a first data converting section configured to convert the third design data whose coordinate is converted by the coordinate converting section into a first drawing data; a second data converting section configured to convert data judged not to correspond to the data among the plurality of third design data into a second drawing data without performing the coordinate conversion; and a drawing section configured to draw the pattern by referring to drawing data including the first and second drawing data and irradiating the charged beam onto the sample, the drawing section drawing patterns in the subfields by referring to the first drawing data using the unit field as a drawing unit for each of the plurality of subfields, and in a case where there exists a pattern not being drawn in the subfields, the drawing section drawing the pattern not being drawn on a desired position in the subfields by referring to the second drawing data and by moving the sample, or by referring to the second drawing data and by adjusting a deflection position of the charged beam on the subfields.

According to an aspect of the present invention, there is provided semiconductor device manufacturing method comprising: preparing a sample including a substrate and a resist film formed on the substrate; and drawing a pattern on the resist film by a charged beam drawing method according to an aspect of the present invention.

BRIEF DESCRIPTION OF THE SEVERAL VIEWS OF THE DRAWING

FIG. 1 is a flow chart showing an electron beam drawing data creation method of an embodiment;

FIG. 4 is a view showing a distribution of OK areas and NG areas in a subfield;

FIG. 5 is a view schematically showing drawing data corresponding to pattern data not requiring a coordinate conversion among design data;

FIG. 15 is a view showing SEM photos of resist pattern drawn by a conventional drawing method by use of the design data of FIG. 14, and obtained after a developing process and the like.

DETAILED DESCRIPTION OF THE INVENTION

Hereinafter, embodiments of the present invention will be described with reference to the drawings.

Figure 2:
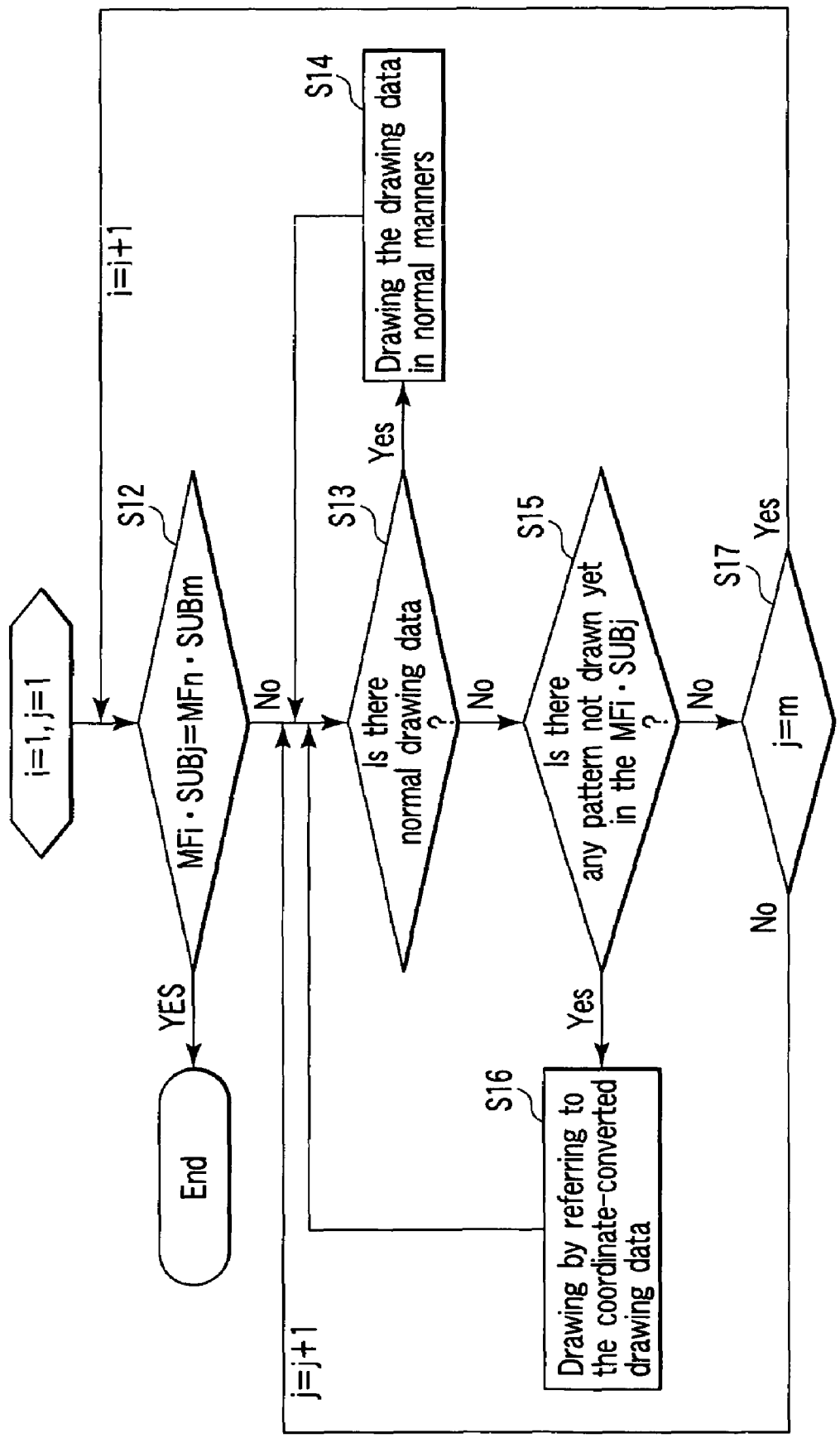
FIG. 2 is a flow chart showing an electron beam drawing method of the embodiment.

FIG. 1 is a flow chart showing an electron beam drawing data creation method of an embodiment. FIG. 2 is a flow chart showing an electron beam drawing method of the present embodiment.

First, design data of a device pattern to be formed on a wafer (sample) is prepared (step S1). The above design data is prepared beforehand, or newly created by a designer.

The device pattern includes a plurality of patterns. The design data includes a plurality of data (pattern data) corresponding to these plural patterns.

Next, the design data is divided into meshes, for each field corresponding to the deflection width of a drawing apparatus (step S2).

Figure 3:
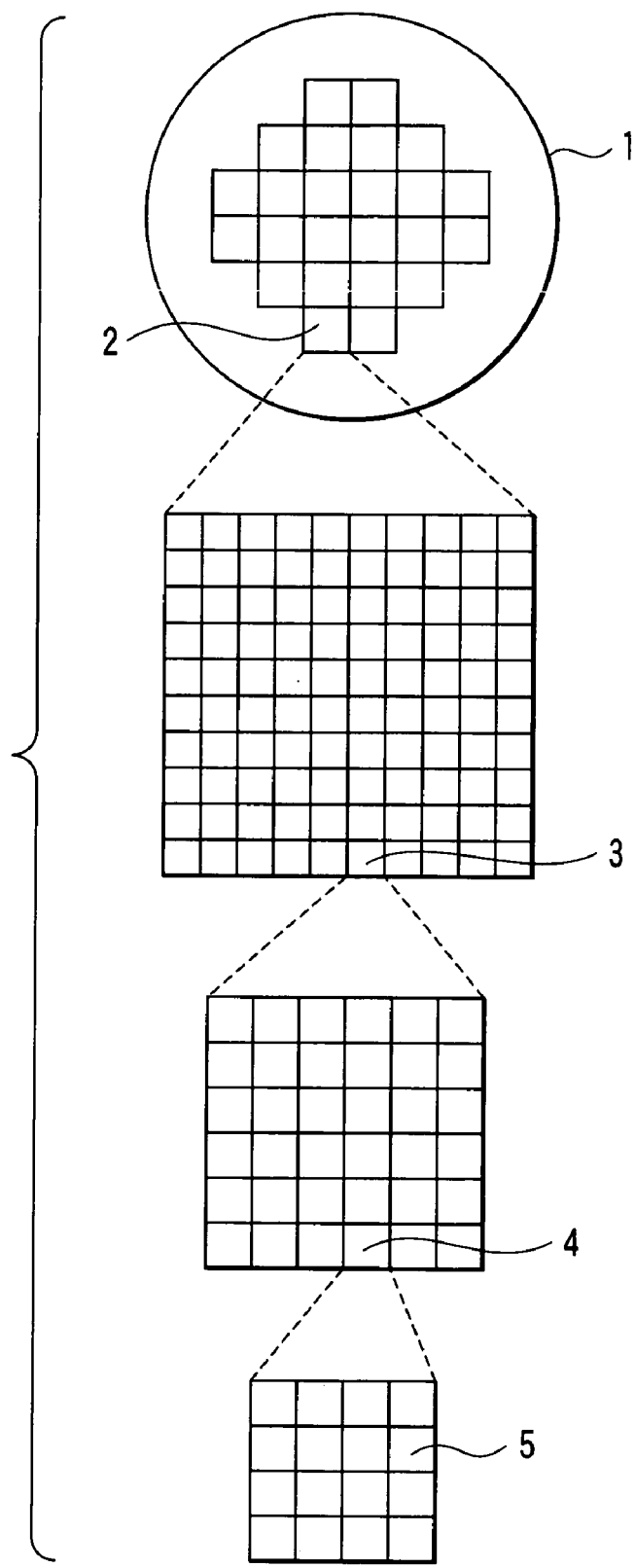
FIG. 3 is a view showing a configuration of fields of the embodiment.

The configuration of fields in the present embodiment, as shown in FIG. 3, is provided in such a manner that a chip 2 on a wafer 1 is divided into a plurality (n pieces) of fields (main fields) 3, the main field 3 is divided into a plurality (m pieces) of areas (subfields) 4, and the subfield 4 is divided into a plurality (16 pieces) of areas (divided subfields) 5.

Meanwhile, dimensions to become a critical pattern in each subfield (critical pattern dimensions) are set based on the above design data (step S3).

Further, a resolution evaluation of resist pattern (evaluation of quality of resolution of resist pattern) in each subfield is performed (step S4). Based on the result of the above resolution evaluation (evaluation of the quality of the resolution), each divided subfield is classified as a divided subfield whose resolution is acceptable (hereinafter referred to as "OK area") or a divided subfield whose resolution is rejectable (hereinafter referred to as "NG area"). In addition, based on the result of the above classification, a distribution table in which "OK areas" with acceptable resolution and "NG areas" with rejectable resolution in the subfield are specified (OK/NG area distribution table) is created (step S5).

Figure 14:
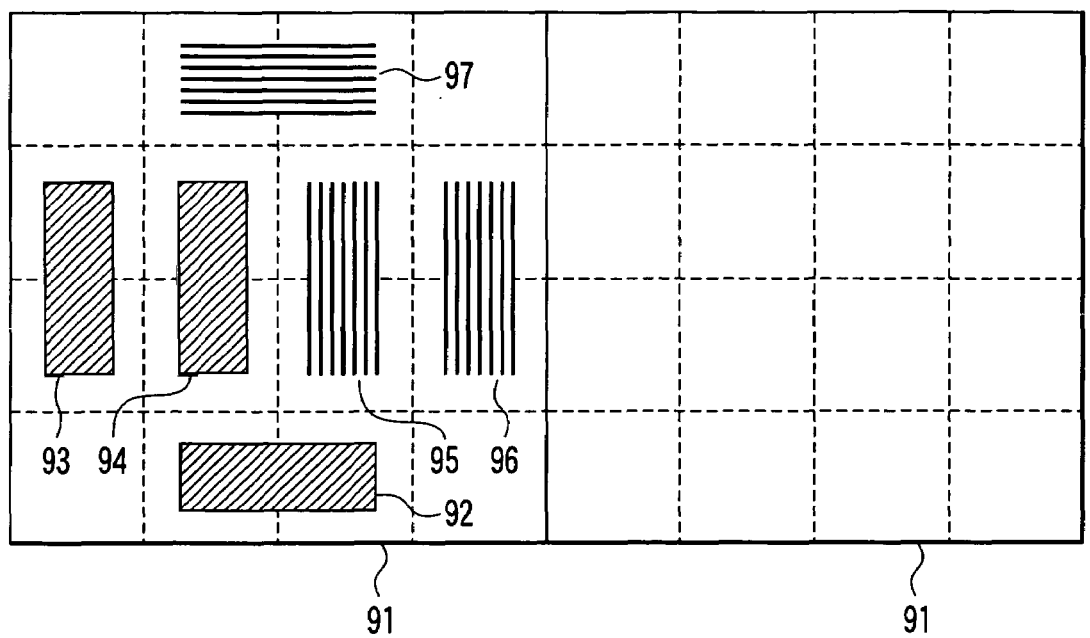
FIG. 14 is a view schematically showing an example of the field division of design data that is performed in electron beam drawing.
Figure 15:
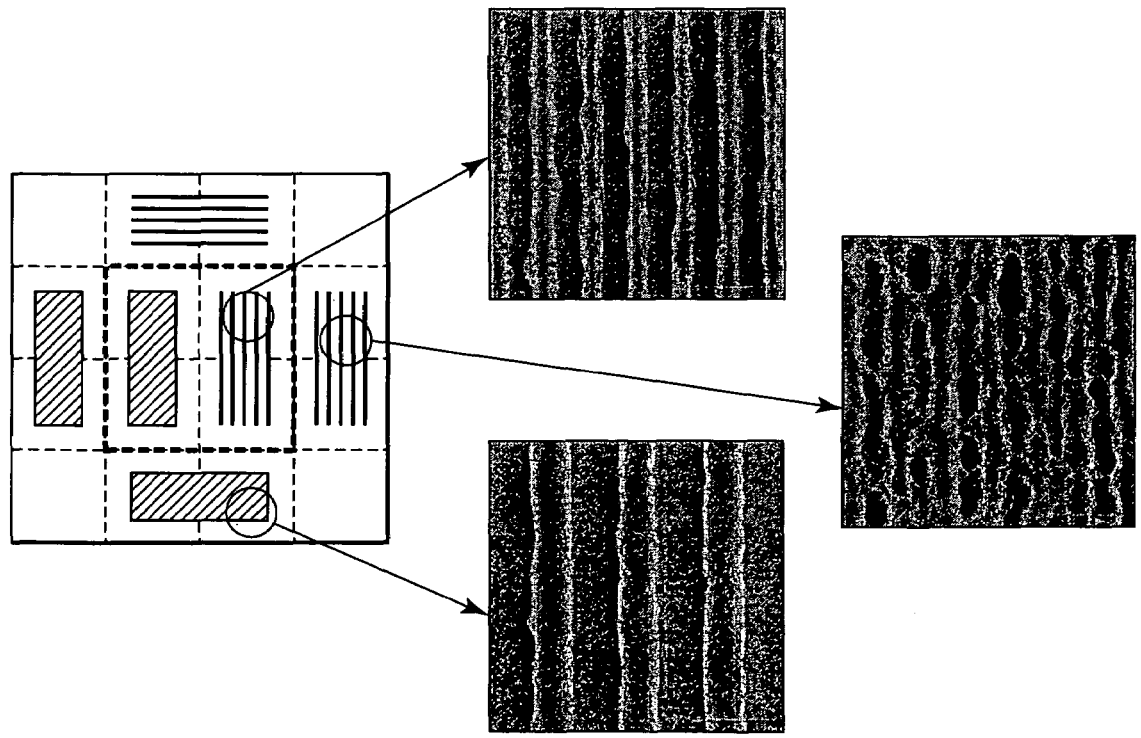

In the case of the subfield shown in FIG. 14, 2×2 divided subfields at the center become OK areas, 12 divided subfields outside thereof become NG areas, and a distribution table including these items of information is created, as shown in FIG. 4.

The above resolution evaluation is carried out to patterns having minimum dimensions necessary for circuit operation. More specifically, a resist is applied onto a wafer, a pattern is drawn on the above resist, the resist having the pattern drawn thereon is developed and thereby a resist pattern is formed. Thereafter, dimensional variations of the resist pattern in the field are evaluated. The wafer and the resist are same as a wafer and a resist to be used practically.

As another method of the resolution evaluation, there is a real time evaluation method. For example, there is a real time evaluation method using a beam calibration mark provided beforehand on a movable stage of a drawing apparatus.

More specifically, first, one of plural divided subfields is selected. Herein, the number of divided subfields is 16.

Next, the position of the movable stage is set so that the beam calibration mark should be set at the position corresponding to the selected divided subfield (first step).

Next, the beam calibration mark on the movable stage is scanned with an electron beam (second step).

Next, an intensity profile of the electron beam that has scanned the beam calibration mark is acquired (third step).

The first to third steps are carried out to remaining divided subfields (fourth step).

In the case of using the above evaluation method, the resolution distribution in the filed is evaluated in real time manners. Therefore, even if the apparatus conditions change owing to changes over time and the like, it is possible to suppress defects of the pattern resolution. Thereby, it becomes possible to further improve the manufacturing yields of semiconductor products.

Before the critical pattern dimension setting (step S3), the resolution evaluation (step S4) and the OK/NG area distribution table (step S5) may be performed, or alternatively, the step S3 and the steps S4, S5 may be performed in parallel (simultaneously).

Next, with regard to the pattern size and pattern position of each pattern data in the design data, two conditions, (1) whether the pattern size is equal to the critical dimensions or less or not, and (2) whether the pattern position is in the NG area or not, are judged (step S6).

As the result of the judgment, pattern data that does not satisfy the above (1) and (2) at the same time are, in normal manners, converted into a drawing data format corresponding to the drawing apparatus (step S7).

In the case of FIG. 14, the design data 92 to 95 are the pattern data that does not satisfy the above (1) and (2) at the same time.

In FIG. 5, drawing data 92' to 95' corresponding to the design data 92 to 95 converted into the drawing data format are shown schematically. In FIG. 5, the area entangled by a dotted line corresponds to an OK area, and the outside of the area entangled by the dotted line corresponds to an NG area.

The pattern data converted into the drawing data format (drawing data) is recorded (stored) into a first drawing data storage device (step S8). Thereafter, the procedure goes back to the step S6, where judgment is performed on the next pattern data.

on the other hand, as the result of the judgment in step S6, the following process (step S9) is performed to the pattern data that satisfies the above (1) and (2) at the same time. That is, a coordinate conversion is carried out so that the pattern data falls in the OK area. The coordinate conversion is a coordinate conversion on the design data.

In the case of FIG. 14, the patterns 96, 97 become the pattern data that satisfies the above (1) and (2) at the same time.

Figure 6:
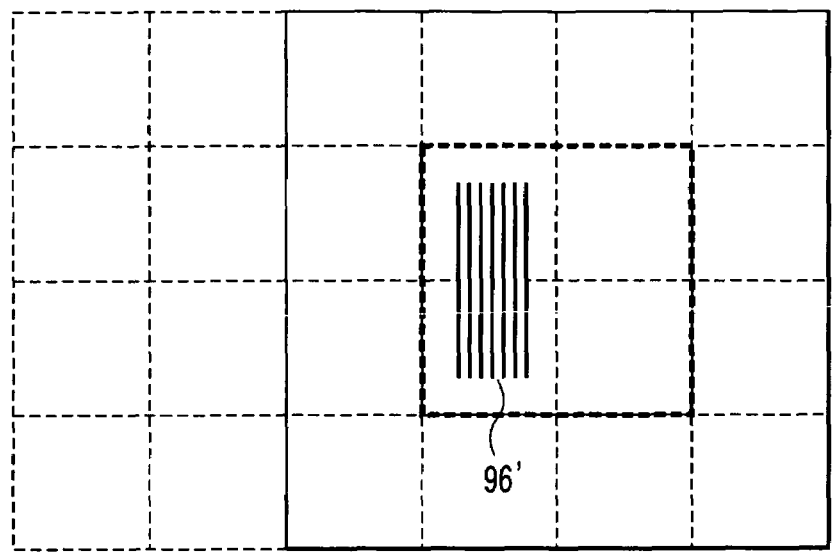
FIG. 6 is a view schematically showing drawing data corresponding to pattern data requiring a coordinate conversion among design data.
Figure 7:
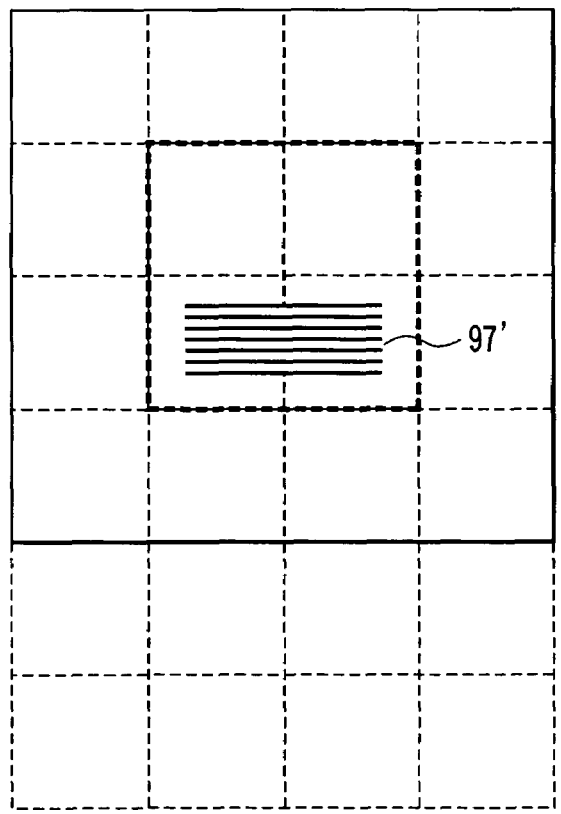
FIG. 7 is a view schematically showing another drawing data corresponding to another pattern data requiring a coordinate conversion among design data.

In FIG. 6, drawing data 96' corresponding to the data 96 converted into the drawing data format is shown schematically. In FIG. 7, drawing data 97' corresponding to the data 97 converted into the drawing data format is shown schematically. In FIGS. 6 and 7, the area entangled by a dotted line corresponds to an OK area, and the outside of the area entangled by the dotted line corresponds to an NG area.

Thereafter, in the same manner as in steps S7, S8, the pattern data is converted into the drawing data format, and is recorded into a second drawing data storage device (steps S10, S11). The first drawing data storage device and the second drawing data storage device may be one common drawing data storage device.

Thereafter, the procedure goes back to the step S6, where judgment is performed on the next pattern data.

In this manner, the judgment in step S6 is performed to all the pattern data. As a result, the drawing data are divided into two groups, i.e., those obtained by converting the pattern data normally into the drawing data format without performing the coordinate conversion (normal drawing data), and those obtained by converting the pattern data into the drawing data format after performing the coordinate conversion (coordinate-converted drawing data). Further, the coordinate-converted drawing data are divided into a plurality of groups, except the case where all the pattern data are coordinate-converted in the same manner.

The above processes are carried out to each subfield of each main field, and thereby necessary drawing data are acquired.

Next, an electron beam drawing method using the electron beam drawing data obtained by the creation method of the present embodiment mentioned above will be explained with reference to FIG. 2.

In FIG. 2, MFi·SUBj shows a subfield SUBj (j=j, ..., m) in a main field MFi (i=1, ..., n).

First, the first MFi·SUBj (i=1, j=1) is selected, the normal drawing data concerning MF1·SUB1 is referred to, and it is judged whether there is normal drawing data or not (steps S12, S13). When it is judged that there is normal drawing data, the electron beam drawing apparatus sequentially draws patterns in the OK areas onto a desired position in the resists on the wafer in normal manners (step S14).

In the case of FIG. 14, the patterns corresponding to the design data 92 to 95 are sequentially drawn onto a desired position in the resists on the wafer in normal manners.

On the other hand, when it is judged that there is not normal drawing data and after the completion of the step S14, it is judged whether or not there is any pattern not drawn yet in the above MFi·SUBj (step S15).

As a result of the judgment, when there are patterns not drawn yet, i.e., when there are patterns in the NG area, and the coordinate conversion of the pattern data is performed, the coordinate-converted drawing data is referred to, and the electron beam drawing apparatus sequentially draws the patterns in the NG area onto the resists on the wafer (step S16).

In the case of FIG. 14, the patterns corresponding to the design data 96, 97 are sequentially drawn onto a desired position in the resists on the wafer.

Herein, in the step S16, an X-Y stage (movable stage) having the wafer loaded thereon is moved, or the irradiation position of the electron beam on the wafer (EB irradiation position) is changed, so that the patterns should be drawn onto a desired position on the resists on the wafer. The deflection of the EB irradiation position can be performed by a deflector that performs the positioning of the electron beam in the subfield.

Next, j is changed into j+1, and the steps S14, S15 are performed. These steps S13 to S16 are carried out until j becomes m in step S17. That is, they are carried out until drawing of all the patterns in all the subfields in the main field MFi (herein MF1) is completed.

Next, i is changed into i+1, and the steps S12 to S17 are performed. These steps S12 to S17 are carried out until i becomes n in step S12. That is, they are carried out until drawing of all the patterns in all the subfields in all the main fields is completed.

Figure 8:
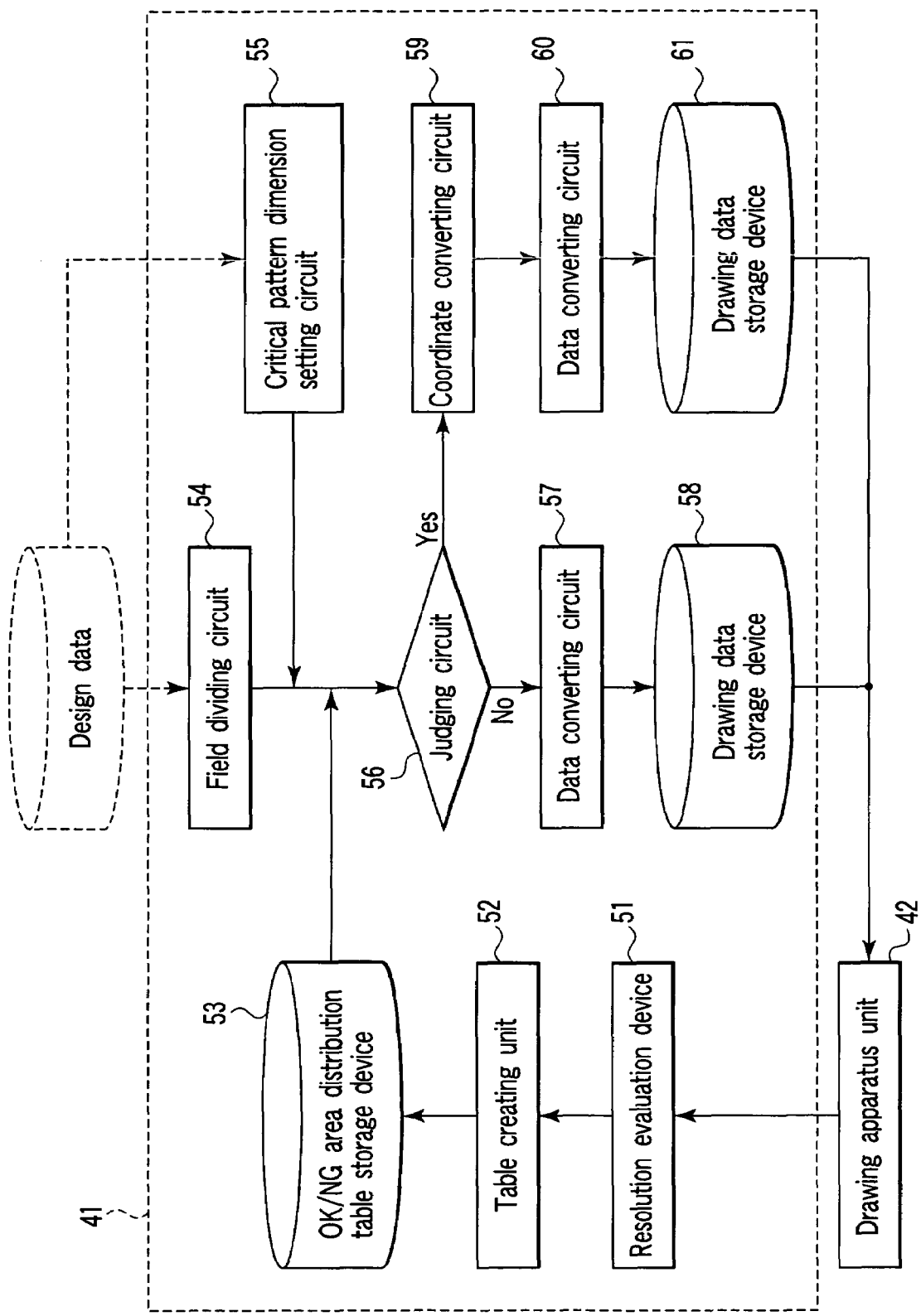
FIG. 8 is a diagram schematically showing a configuration of a charged beam drawing apparatus of the embodiment.

FIG. 8 is a diagram schematically showing a configuration of a charged beam drawing apparatus for embodying the electron beam drawing data creation method and the electron beam drawing method of the present embodiment described above.

The charged beam drawing apparatus of the present embodiment includes a drawing data creating unit 41 for creating electron beam drawing data, and a drawing apparatus 42 for performing electron beam drawing by use of the electron beam drawing data created by the drawing data creating unit 41.

The charged beam drawing apparatus of the present embodiment differs from the conventional one in that it includes the drawing data creating unit 41. Further, the drawing apparatus 42 is basically same as the conventional drawing apparatus, except that drawing data to be used are different, and that in the case of performing drawing by use of the coordinate-converted drawing data, the X-Y stage is moved, or the EB irradiation position on the wafer is changed, so that the above patterns should be drawn on a desired position in the resists on the wafer.

The drawing data creating unit 41, as shown in FIG. 8, includes a resolution evaluation device 51, a table creating unit 52, a storage device 53, a field dividing circuit 54, a critical pattern dimension setting circuit 55, a judging circuit 56, a first data converting circuit 57, a first drawing data storage device 58, a coordinate converting circuit 59, a second data converting circuit 60, and a second drawing data storage device 61. The resolution evaluation device 51 performs a resolution evaluation of resist pattern (evaluation of quality of resolution of resist pattern) in each subfield. The table creating unit 52 creates the OK/NG area distribution table based on the result of the resolution evaluation acquired by the resolution evaluation device 51. The storage device 53 records (stores) the OK/NG area distribution table created by the table creating unit 52. The field dividing circuit 54 divides the design data into meshes for each field corresponding to the deflection width of the drawing apparatus 42. The critical pattern dimension setting circuit 55 sets the critical pattern dimensions in each subfield based on the design data. The judging circuit 56 judges, with regard to the pattern size and pattern position of each pattern data in the design data, two conditions, (1) whether or not the pattern size is equal to the critical dimensions or less, and (2) whether or not the pattern position is in the NG area. The first data converting circuit 57 converts pattern data that are judged not to satisfy the above (1) and (2) at the same time by the judging circuit 56 into a drawing data format corresponding to the drawing apparatus 42 in normal manners. The first drawing data storage device 58 records (stores) the pattern data converted into the drawing data format (drawing data) by the first data converting circuit 57. The coordinate converting circuit 59 performs a coordinate conversion so that the pattern data judged to satisfy the above (1) and (2) at the same time by the judging circuit 56 is within in the OK area. The second data converting circuit 60 converts the pattern data converted by the coordinate converting circuit 59 into the drawing data format corresponding to the drawing apparatus 42. The second drawing data storage device 61 records (stores) the pattern data converted into the drawing data format by the second data converting circuit 60 (drawing data).

The first data converting circuit 57 and the second data converting circuit 60 may be one common data converting circuit. In the same manner, the first drawing data storage device 58 and the second drawing data storage device 61 may be one common drawing data storage device.

Figure 9:
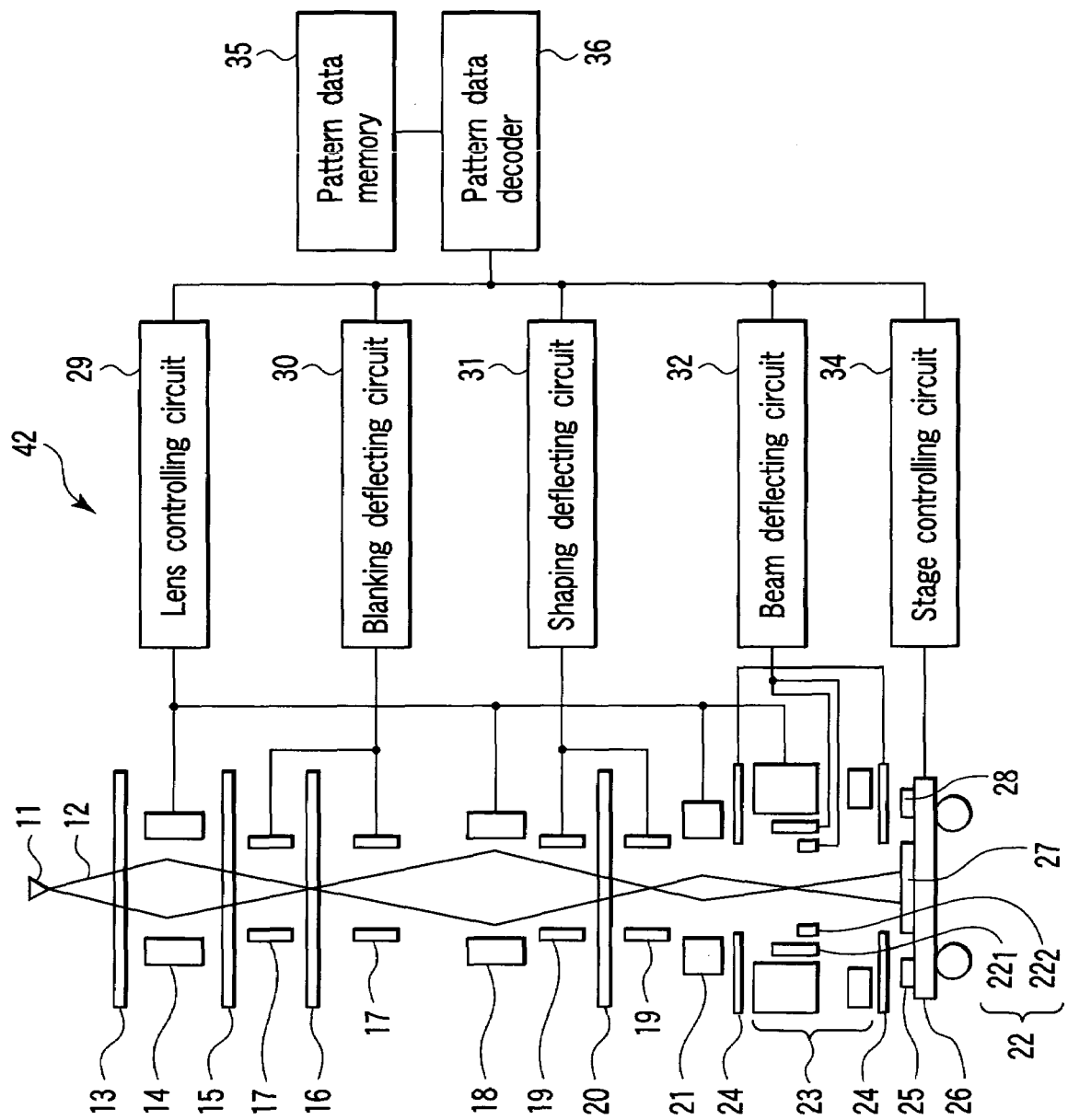
FIG. 9 is a diagram schematically showing a configuration of a drawing apparatus in the charged beam drawing apparatus of the embodiment.

FIG. 9 is a diagram schematically showing a configuration of the drawing apparatus 42.

An electron beam 12 emitted from an electron gun 11 goes through a current limit aperture mask 13. The current density of the electron beam 12 that has gone through the current limit aperture mask 13 is adjusted by a condenser lens 14. The electron beam 12 whose current density is adjusted illuminates a first shaping aperture mask 15 evenly.

The electron beam (image) that has gone through the first shaping aperture mask 15 is focused onto a second shaping aperture (CP aperture) 20 by a projector lens 18.

An optical overlapping degree of the first shaping aperture mask 15 and the second shaping aperture mask 20 is controlled by a shaping deflector 19. The optical overlapping degree is judged by the overlapping with the second shaping aperture mask 20 formed by the shaping deflector 19.

The image by the optical overlapping of the first shaping aperture mask 15 and the second shaping aperture mask 20 is reduced by a reducing lens 21. This reduced image is focused onto a wafer (sample) 27 by an objective lens 23. The condenser lens 14, the projector lens 18, the reducing lens 21 and the objective lens 23 are controlled by a lens controlling circuit 29.

The position of the electron beam 12 on the wafer 27 is set by the voltage applied to an objective deflector 22. The objective deflector 22 includes a main deflector $22_1$ and a sub deflector $22_2$. The main deflector $22_1$ positions the electron beam in the subfield in the main field, and the sub deflector $22_2$ positions the electron beam in the divided subfield in the subfield.

The voltage applied to the main deflector $22_1$ and the sub deflector $22_2$ is given from a beam deflecting circuit 32. That is, the beam deflecting circuit 32 supplies the voltage corresponding to the data read from a storage device 35 (pattern data to be drawn) to the main deflector $22_1$ and the sub deflector $22_2$. Depending on the size of the voltage supplied to the main deflector $22_1$ and the sub deflector $22_2$, the deflection amount of the electron beam 12 changes, and the electron beam 12 on the subfield and the divided subfield is judged in correspondence to this deflection amount.

The main deflector $22_1$ and the sub deflector $22_2$ and the shaping deflector 19 are, for example, electrostatic deflectors. By use of the above deflectors, it is possible to deflect the electron beam 12 at a high speed and high precision.

The electron beam 12 that has gone through the second shaping aperture mask 20, the reducing lens 21 and the objective lens 23 is detected by a detector 24. Thereby, the intensity distribution of the electron beam that has gone through the second shaping aperture mask 20, and is in a surface nearly parallel with the second shaping aperture 20 just before being irradiated onto the wafer 27 can be detected. The detector 24 is made of for example a Faraday cup, and the intensity of the electrode beam is given for example by a current.

The wafer 27 together with a mark stand 25 is arranged on a movable stage 26. By moving the movable stage 26, the wafer 27, the Faraday cup 28 or the mark stand 25 is selected. The movement of the movable stage 26 is controlled by a stage controlling circuit 34.

Further, when the position of the electron beam 12 on the wafer 27 is moved, the electron beam 12 is deflected onto a blanking aperture mask 16 by a blanking deflector 17, so that unnecessary portions on the wafer 27 should not be exposed. Thereby, the electron beam does not reach the surface of the wafer 27, so that the unnecessary portions on the wafer 27 are prevented from being exposed. The voltage to be applied to the blanking deflector 17 is given from the blanking deflecting circuit 30. That is, the blanking deflecting circuit 30 applies the voltage corresponding to the data read from the storage device 35 (pattern data to be drawn) to the blanking deflector 17.

Various data necessary for drawing are recorded (stored) in the storage device 35. In the storage device 35, drawing data sent from drawing data storage devices 58, 61 are also recorded (stored). The data read from the storage device 35 are sent to various circuits 29, 30, 31, 32 and 34.

Next, a semiconductor device manufacturing method of the present embodiment will be explained hereinafter.

The semiconductor device manufacturing method of the present embodiment is a method including a step where a pattern is drawn on a resist film by the charged beam drawing method of the present embodiment. More specifically, the method is as described below.

First, a resist film is applied onto a substrate including a semiconductor substrate. The semiconductor substrate is, for example, a silicone substrate, or an SOI substrate.

Next, a pattern is drawn on the resist film by the charged beam drawing method of the present embodiment. Thereafter, the resist film is developed, thereby a resist pattern is formed.

Next, using the resist pattern as a mask, the substrate is etched, thereby a pattern is formed on the substrate.

Herein, when the underlying layer of the resist film (most top layer of substrate) is a polycrystalline silicone film or a metal film, an electrode pattern, a wire pattern and the like are formed.

When the underlying layer of the resist film is an insulation film, a fine contact hole pattern, a gate insulation film and the like are formed.

When the underlying layer of the resist is the semiconductor substrate, an isolation trench (STI) and the like are formed.

Meanwhile, the present invention is not limited to the above embodiment. For example, in the above embodiment, the case of an OK/NG area distribution where portions near the center of the subfield are OK areas has been explained. However, the present invention is effective also when applied to other OK/NG area distribution than the above.

Figure 10:
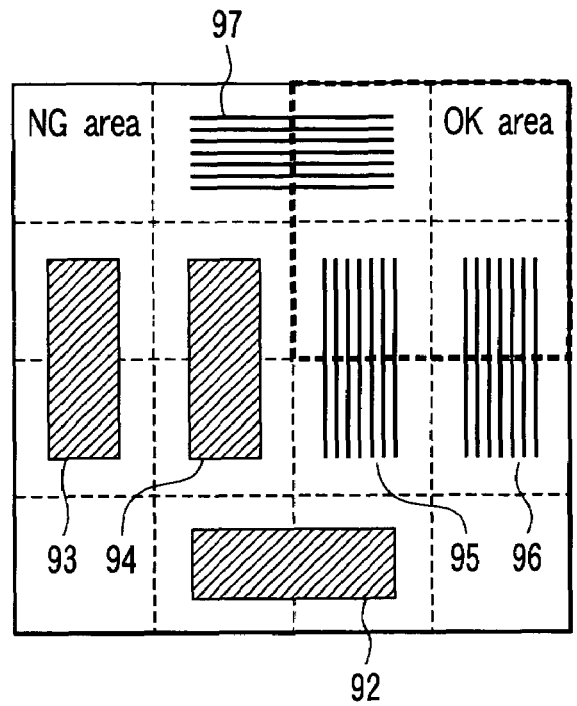
FIG. 10 is a view showing a distribution of OK/NG areas where the area apart from the field center is an OK area.

For example, as shown in FIG. 10, in some conditions of the drawing apparatus, there is an OK/NG area distribution where portions displaced from the field center are OK areas. In such a case, drawing data as shown in FIGS. 11 to 13 are created, and drawing is performed, thereby the same effects as in the present embodiment can be attained.

Figure 11:
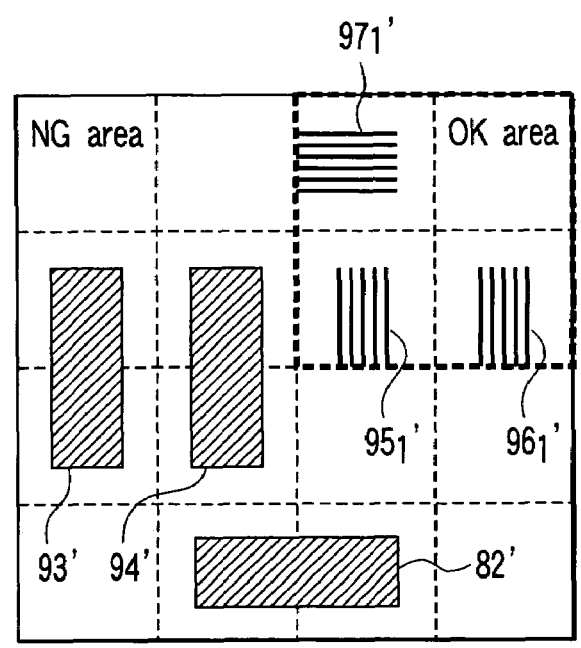
FIG. 11 is a view schematically showing drawing data corresponding to data not requiring a coordinate conversion among data of FIG. 10.

FIG. 11 shows design data 92 to 94 in the NG areas and data 95 to 97 in the OK areas, i.e., drawing data corresponding to patterns not requiring the coordinate conversion.

Figure 12:
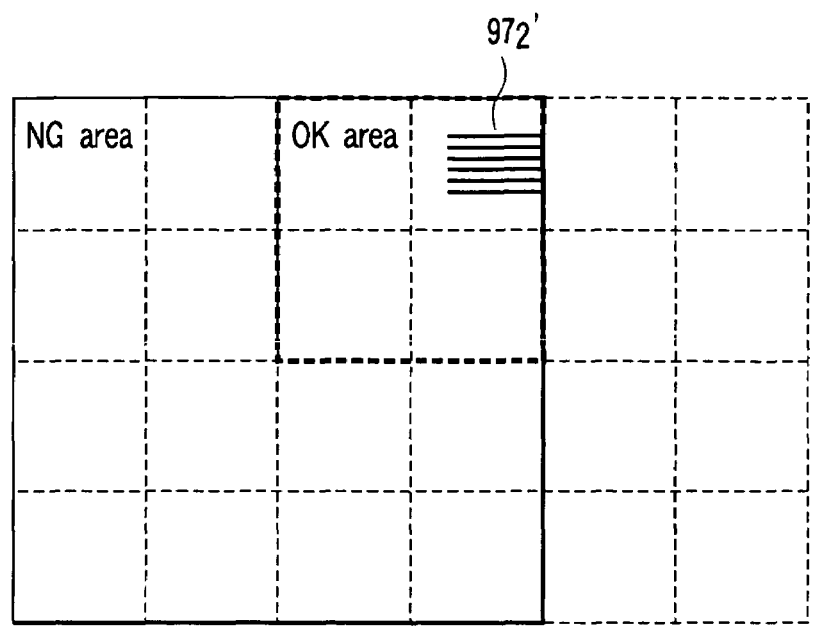
FIG. 12 is a view schematically showing drawing data corresponding to data requiring a coordinate conversion among data of FIG. 10.

FIG. 12 shows drawing data created by performing the coordinate conversion on data 97 in the NG area in FIG. 10.

Figure 13:
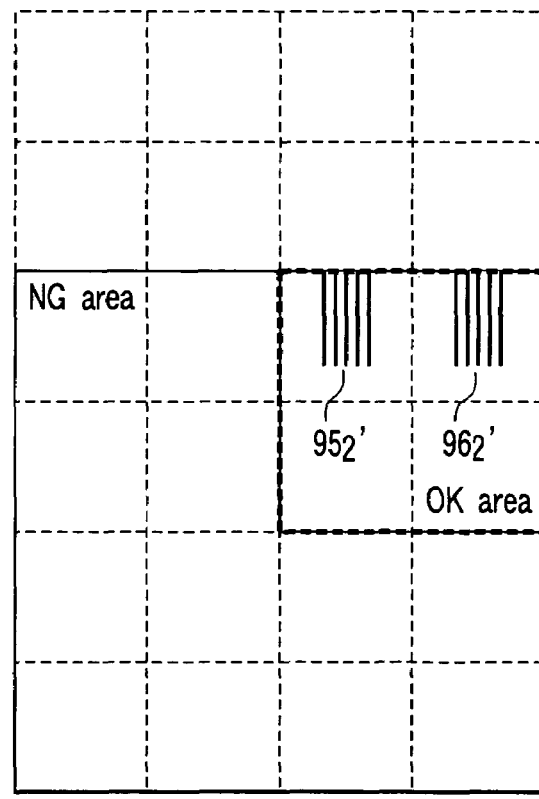
FIG. 13 is a view schematically showing drawing data corresponding to another data requiring a coordinate conversion among data of FIG. 10.

FIG. 13 shows drawing data created by performing the coordinate conversion on data 95, 97 in the NG area in FIG. 10.

The data 95 to 97 corresponding to the pattern of the critical pattern dimensions lie over the NG areas and the OK areas. The data 95 to 97 in the OK areas becomes drawing data $95_1'$ to $97_1'$ without the coordinate conversion, and the data 95 to 97 in the NG areas becomes drawing data $95_2'$ to $97_2'$ through the coordinate conversion.

Further, in the above embodiment, the case of the drawing apparatus and the drawing method using the electron beam has been explained. However, the present invention may be also applied to a drawing apparatus and a drawing method using other charged beam such as an ion bean in the same manners.

Furthermore, in the above embodiment, the case where a wafer is used as a sample (semiconductor device manufacturing method) has been explained. However, the present invention may be also applied to a case using a transparent substrate such as a quartz substrate (photo mask manufacturing method, flat panel display manufacturing method) in the same manners.

Moreover, in the above embodiment, the case where the drawing area is divided into two hierarchical fields has been explained. However, the drawing area may be divided into three or more hierarchical fields. For example, three hierarchical fields include a plurality of main fields, a plurality of subfields, sub-subfields of the layer lower than the above plural subfields and divided subfields (unit fields) of the layer lower than the above sub-subfields. Corresponding to this, deflectors include three stage deflectors of a main deflector, a sub deflector and a sub-sub deflector.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of creating charged beam drawing data used for a charged beam drawing apparatus to draw a pattern on a drawing area of a sample by irradiating a charged beam onto the sample, the method comprising:

selecting a charged beam drawing apparatus which divides the drawing area into two or more hierarchical fields including a plurality of main fields, a plurality of subfields which are lower in layer than the plurality of main fields and a plurality of unit fields which are lower in layer than the plurality of subfields, and draws a pattern using the unit field as a drawing unit, as the charged beam drawing apparatus to draw the pattern;

dividing design data corresponding to the pattern to be drawn on the drawing area into a plurality of first design data corresponding to the plurality of main fields, dividing each of the plurality of first design data into a plurality of second design data corresponding to the plurality of subfields, and dividing each of the plurality of second design data into a plurality of third design data corresponding to the plurality of unit fields;

evaluating quality of resist resolution to a predetermined dimension on each of the plurality of unit fields;

creating a table which relates the plurality of unit fields to the quality of the resist resolution based on an evaluation result acquired by the evaluating the quality of the resist resolution;

judging whether or not each of the plurality of third design data corresponds to data having the predetermined dimension and corresponds to a pattern falling in the unit field which the quality of the resist resolution is rejectable based on the predetermined dimension and the table; and converting data judged to correspond to the data among the plurality of third design data into first drawing data after performing a coordinate conversion so that the data fall in the unit field which the resist resolution is acceptable, and converting data judged not to correspond to the data among the plurality of third design data into second drawing data without performing the coordinate conversion.

2. The method of creating charged beam drawing data according to claim 1, wherein the hierarchical fields are two hierarchical fields including the plurality of main fields, the plurality of subfields and divided subfields as the plurality of unit fields, or three hierarchical fields including the plurality of main fields, the plurality of subfields, subsubfields which are lower in layer than the plurality of subfields and divided subfields as the plurality of unit fields.

3. A charged beam drawing method using a charged beam drawing apparatus to draw a pattern on a drawing area of a sample by irradiating a charged beam onto the sample, the method comprising:

selecting a charged beam drawing apparatus which divides the drawing area into two or more hierarchical fields including a plurality of main fields, a plurality of subfields which are lower in layer than the plurality of main fields and a plurality of unit fields which are lower in layer than the plurality of subfields, and draws a pattern using the unit field as a drawing unit, as the charged beam drawing apparatus to draw the pattern;

dividing design data corresponding to the pattern to be drawn on the drawing area into a plurality of first design data corresponding to the plurality of main fields, dividing each of the plurality of first design data into a plurality of second design data corresponding to the plurality of subfields, and dividing each of the plurality of second design data into a plurality of third design data corresponding to the plurality of unit fields;

evaluating quality of resist resolution to a predetermined dimension on each of the plurality of unit fields;

creating a table which defines a unit field having an acceptable resist resolution and a unit field having a rejectable resist resolution among the plurality of unit fields based on an evaluation result acquired by the evaluating the quality of the resist resolution;

judging whether or not each of the plurality of third design data corresponds to data having the predetermined dimension and corresponds to a pattern falling in the unit field which the quality of the resist resolution is rejectable based on the predetermined dimension and the table; and converting data judged to correspond to the data among the plurality of third design data into first drawing data after performing a coordinate conversion so that the data fall in the unit field which the resist resolution is acceptable, and converting data judged not to correspond to the data among the plurality of third design data into second drawing data without performing the coordinate conversion.

4. The charged beam drawing method according to claim 3, wherein the evaluating the quality of the resist resolution to the predetermined dimension on each of the plurality of unit fields is performed in real time based on a shape of the charged beam which is irradiated from the plurality of unit fields.

5. The charged beam drawing method according to claim 3, wherein the hierarchical fields are two hierarchical fields including the plurality of main fields, the plurality of subfields and divided subfields as the plurality of unit fields, or three hierarchical fields including the plurality of main fields, the plurality of subfields, sub-subfields which are lower in layer than the plurality of subfields and divided subfields as the plurality of unit fields.

6. The charged beam drawing method according to claim 4, wherein the hierarchical fields are two hierarchical fields including the plurality of main fields, the plurality of subfields and divided subfields as the plurality of unit fields, or three hierarchical fields including the plurality of main fields, the plurality of subfields, sub-subfields which are lower in layer than the plurality of subfields and divided subfields as the plurality of unit fields.

7. A charged beam drawing apparatus to draw a pattern on a drawing area of a sample by irradiating a charged beam onto the sample, the pattern being drawn using a unit field as a drawing unit, the charged beam drawing apparatus comprising:

a first dividing section configured to divide the drawing area into two or more hierarchical fields including a plurality of main fields, a plurality of subfields which are lower in layer than the plurality of main fields and a plurality of unit fields which are lower in layer than the plurality of subfields, a second dividing section configured to divide design data corresponding to the pattern to be drawn on the drawing area into a plurality of first design data corresponding to the plurality of main fields, dividing each of the plurality of first design data into a plurality of second design data corresponding to the plurality of subfields, and dividing each of the plurality of second design data into a plurality of third design data corresponding to the plurality of unit fields;

a resolution evaluating section configured to evaluate quality of resist resolution to a predetermined dimension on each of the plurality of unit fields;

a table creating section configured to create a table which relates the plurality of unit fields to the quality of the resist resolution based on an evaluation result acquired by the evaluating the quality of the resist resolution;

a judging section configured to judge whether or not each of the plurality of third design data corresponds to data having the predetermined dimension and corresponds to a pattern falling in the unit field which the quality of the resist resolution is rejectable based on the predetermined dimension and the table;

a coordinate converting section configured to convert a coordinate of data judged to correspond to the data among the plurality of third design data into a coordinate so that the data fall in the unit field which the resist resolution is acceptable, a first data converting section configured to convert the third design data whose coordinate is converted by the coordinate converting section into a first drawing data;

a second data converting section configured to convert data judged not to correspond to the data among the plurality of third design data into a second drawing data without performing the coordinate conversion; and a drawing section configured to draw the pattern by referring to drawing data including the first and second drawing data and irradiating the charged beam onto the sample, the drawing section drawing patterns in the subfields by referring to the first drawing data using the unit field as a drawing unit for each of the plurality of subfields, and in a case where there exists a pattern not being drawn in the subfields, the drawing section drawing the pattern not being drawn on a desired position in the subfields by referring to the second drawing data and by moving the sample, or by referring to the second drawing data and by adjusting a deflection position of the charged beam on the subfields.

8. The charged beam drawing apparatus according to claim 7,
wherein the resolution evaluating section performs the resist resolution evaluation in real time based on an a shape of the charged beam which is irradiated from the plurality of unit fields.

9. The charged beam drawing apparatus according to claim 7,
wherein the hierarchical fields are two hierarchical fields including the plurality of main fields, the plurality of subfields and divided subfields as the plurality of unit fields, or three hierarchical fields including the plurality of main fields, the plurality of subfields, sub-subfields which are lower in layer than the plurality of subfields and divided subfields as the plurality of unit fields.

10. The charged beam drawing apparatus according to claim 8,
wherein the hierarchical fields are two hierarchical fields including the plurality of main fields, the plurality of subfields and divided subfields as the plurality of unit fields, or three hierarchical fields including the plurality of main fields, the plurality of subfields, sub-subfields which are lower in layer than the plurality of subfields and divided subfields as the plurality of unit fields.

11. A semiconductor device manufacturing method comprising:
preparing a sample including a substrate and a resist film formed on the substrate; and
drawing a pattern on the resist film by a charged beam drawing method according to claim 3.

12. The semiconductor device manufacturing method according to claim 11, further comprising:
forming a resist pattern by developing the resist film on which the patterns are drawn; and
etching the substrate using the resist pattern as a mask.

* * * * *

UNITED STATES PATENT AND TRADEMARK OFFICE
CERTIFICATE OF CORRECTION

| | | |
|---|---|---|
| PATENT NO. | : 7,368,735 B2 | Page 1 of 1 |
| APPLICATION NO. | : 11/295533 | |
| DATED | : May 6, 2008 | |
| INVENTOR(S) | : Yoneda | |

It is certified that error appears in the above-identified patent and that said Letters Patent is hereby corrected as shown below:

\* Claim 2, column 12, line 2, change "subsubfields" to --sub-subfield--.

Claim 8, column 14, line 15, delete "an".

Signed and Sealed this

Twenty-ninth Day of July, 2008

JON W. DUDAS
*Director of the United States Patent and Trademark Office*